(12) United States Patent
Baudelot et al.

(10) Patent No.: US 6,633,195 B2
(45) Date of Patent: Oct. 14, 2003

(54) HYBRID POWER MOSFET

(75) Inventors: Eric Baudelot, Weisendorf (DE);
Manfred Bruckmann, Nuremburg (DE); Heinz Mitlehner, Uttenreuth (DE); Dietrich Stephani, Bubenreuth (DE); Benno Weis, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/911,173

(22) Filed: Jul. 23, 2001

(65) Prior Publication Data

US 2002/0153938 A1 Oct. 24, 2002

Related U.S. Application Data

(63) Continuation of application No. PCT/DE00/00113, filed on Jan. 13, 2000.

(30) Foreign Application Priority Data

Jan. 22, 1999 (DE) ......................... 199 02 520

(51) Int. Cl.⁷ ............................................. H03K 17/687
(52) U.S. Cl. ........................ 327/430; 327/427; 327/434
(58) Field of Search ................................. 327/427, 430, 327/431, 434; 307/126, 130

(56) References Cited

U.S. PATENT DOCUMENTS

| | | | |
|---|---|---|---|
| 4,523,111 A | 6/1985 | Baliga | |
| 4,893,158 A | 1/1990 | Mihara et al. | |
| 4,945,266 A | 7/1990 | Mori | 307/570 |
| 5,115,369 A | 5/1992 | Robb et al. | 361/93 |
| 5,282,107 A * | 1/1994 | Balakrishnan | 361/18 |
| 5,317,286 A | 5/1994 | Geddes | 331/56 |
| 5,396,085 A | 3/1995 | Baliga | 257/77 |
| 5,624,860 A * | 4/1997 | Plumton et al. | 438/193 |
| 5,889,298 A * | 3/1999 | Plumton et al. | 257/285 |
| 6,259,618 B1 * | 7/2001 | Liaw et al. | 363/147 |

FOREIGN PATENT DOCUMENTS

| | | | |
|---|---|---|---|
| DE | 196 10 135 | * | 6/1997 |
| JP | 63019846 | | 6/1988 |
| JP | 07161986 | | 10/1995 |

OTHER PUBLICATIONS

Muraguchi et al., "A Novel MMIC Power Amplifier for Pocket-Size Cellular Telephones", 1993 IEEE MTT-S Digest, pp. 793-796.

McGrath et al., "A 1.9-GHz GaAs Chip Set for the Personal Handyphone System", 1995 IEEE Transactions on Microwave Theory and Techniques, Jul. No. 7, PT. II, 1995, 1733-1743.

* cited by examiner

Primary Examiner—Terry D. Cunningham
(74) Attorney, Agent, or Firm—Baker Botts LLP

(57) ABSTRACT

A hybrid power MOSFET, comprising a MOSFET and a junction FET, the MOSFET and the junction FET being electrically connected in series is disclosed. In accordance with the present invention, the hybrid power MOSFET is provided with a device for reducing the change in the gate voltage of the junction FET. Thus, a hybrid power MOSFET is obtained in which high over-voltages no longer arise and whose EMC response is much improved.

16 Claims, 6 Drawing Sheets

HYBRID POWER MOSFET

This is a continuation of application No. PCT/DE00/00113 filed Jan. 13, 2000.

FIELD OF THE INVENTION

The present invention relates to a hybrid power MOSFET having a MOSFET and a junction FET, the MOSFET and the junction FET being electrically connected in series.

BACKGROUND OF THE INVENTION

A hybrid power MOSFET is known from DE 196 10 135 C1. This known hybrid power MOSFET is described in detail with reference to FIG. 1.

Referring to FIG. 1, this hybrid power MOSFET has a normally-off n-channel MOSFET 2, in particular a low voltage power MOSFET, and a normally-on n-channel junction FET 4. This high blocking-capability junction FET 4 is also referred to as a Junction Field Effect Transistor (JFET). These two FETs are electrically connected in series such that the source connection S of the junction FET 4 is electrically conductively connected to the drain connection D' of the MOSFET 2, and that the gate connection G of the junction FET 4 is electrically conductively connected to the source connection S' of MOSFET 2. This electrical interconnection of two semiconductor components is also called a cascode circuit, as is known. The low blocking-capability MOSFET 2 in this cascode circuit has an internal bipolar diode $D_{IN}$ which is connected in antiparallel with MOSFET 2 and is referred to generally as an inverse diode or internal freewheeling diode. The normally-off n-channel MOSFET 2 is made of silicon, whereas the normally-off n-channel JFET 4 is made of silicon carbide. This hybrid power MOSFET is designed for a high reverse voltage of over 600 volts and nevertheless has only low losses in the passband.

FIGS. 2, 3, and 4 show a few important characteristics for the normally-on junction FET 4 in more detail. FIG. 2 shows various output characteristics for the junction FET 4, whereas FIG. 3 shows the transfer characteristic for the junction FET 4. This transfer characteristic reveals that the largest drain current $I_D$ flows through the junction FET at a gate voltage $U_G=0$. For this reason, such a junction FET 4 is referred to as normally on. If the gate voltage $U_G$ falls below a threshold voltage $U_{Th}$, the drain current $I_D$ is equal to zero. FIG. 4 shows the drain voltage $U_{DS}$ as a function of the gate voltage $U_{GS}$ for a constant drain current $I_D$. The graph in FIG. 2 reveals that a gate voltage $U_{GS}$ can be used to control the resistance between the drain connection D and the source connection S of the junction FET 4. The control voltage is the gate voltage $U_{GS}$. For this reason, a junction FET is also referred to as a controlled resistor.

This cascode circuit is controlled using the gate voltage $U_{G'S'}$ of the normally-off MOSFET 2. If MOSFET 2 is on or the antiparallel internal diode $D_{IN}$ of MOSFET 2 is conducting a current, the drain voltage $U_{D'S'}$ of MOSFET 2 is approximately zero. The coupling between the gate connection of JFET 4 and the source connection S' of MOSFET 2 means that the gate voltage $U_{GS'}$ of JFET 4 is zero to slightly negative or positive. In accordance with the transfer characteristic shown in FIG. 3, approximately the largest drain current $I_D$ flows through JFET 4. If MOSFET 2 is turned off, the drain voltage $UD_{'S'}$ rises until the maximum permissible reverse voltage of MOSFET 2 has been reached. The value of the reverse voltage in a low voltage power MOSFET 2 is 30 volts, for example. As soon as the value of the drain voltage $U_{D'S'}$ of MOSFET 2 exceeds the value of the threshold voltage $U_{Th}$, the drain current $I_D$ of JFET 4 is zero in accordance with the transfer characteristics shown in FIG. 3. That is to say that the JFET 4 is off. The coupling between the gate connection G of JFET 4 and the source connection S' of MOSFET 2 means that the drain voltage $U_{D'S'}$ of MOSFET 2 is fed back negatively to the gate G of JFET 4.

The graph in FIG. 5 shows the time profile for a turn-off operation in the hybrid power MOSFET from FIG. 1 in more detail. The turn-off operation starts at the time $t_1$. At this time $t_1$, the drain voltage $U_{D'S'}$ of MOSFET 2 starts to rise, i.e. MOSFET 2 becomes live. As already mentioned, this voltage is fed back negatively to the gate G of JFET 4 in this case. Since the drain current $I_D$ does not change, but rather remains constant, the drain voltage $U_{DS'}$ of JFET 4 rises in accordance with the characteristic shown in FIG. 4. As soon as this drain voltage $U_{DS'}$ of JFET 4 is equal to a DC voltage present on the hybrid power MOSFET (time $t_3$), the drain current $I_D$ falls to the value zero in accordance with the transfer characteristic shown in FIG. 3. This is the actual end of the turn-off operation. The continued increase in the drain voltage $U_{D'S'}$ of MOSFET 2 up to the time $t_5$ to its steady-state final value now only influences the blocking response of the hybrid power MOSFET.

MOSFETs are distinguished in that they switch very rapidly. The time interval $t_1$ to $t_5$ characterizing the turn-off operation is significantly shorter than 100 ns, in accordance with datasheet values. Additionally, in accordance with the characteristics in FIGS. 3 and 4, the switching edges of JFET 4 are complete within a span of a few volts, thus enormous gradients arise for voltage and current changes. Since a high value for a current change in connection with unavoidable leakage inductances results in high over-voltages on the component, and high voltage edges impair the EMC response (Electromagnetic Compatibility) of circuits and appliances, it is necessary to reduce these voltage and current change values.

SUMMARY OF THE INVENTION

The present invention provides a device for reducing the change in the gate voltage of the junction FET. Depending on the embodiment of this device, the change in the gate voltage of the JFET can be reduced directly or indirectly. Reducing the gate voltage change flattens the gradient of the voltage and current change, so that high over-voltages no longer arise on the hybrid power MOSFET.

In accordance with the present invention, the gate voltage change of the JFET is influenced directly by connecting a decoupling apparatus between the gate connection of the JFET and the source connection of the MOSFET of the hybrid power MOSFET. This decoupling apparatus is used to moderate or break up the hard coupling between the gate voltage of the JFET and the drain voltage of the MOSFET.

The simplest embodiment of a decoupling apparatus is a gate resistor. This gate resistor forms, together with the ever-present gate capacitance of the JFET, a time constant. The rapid change in the drain voltage of the MOSFET is slowed down by this timer which is formed, so that the switching gradient of the JFET is reduced. The time delay can be set on the basis of the gate capacitance provided for the JFET and on a predetermined gate resistance.

In one advantageous embodiment of the decoupling apparatus, a capacitor is electrically connected in parallel with the gate capacitance of the JFET of the hybrid power MOSFET. This capacitor and the gate resistor can be used to set the switching edge of the JFET of the hybrid power MOSFET virtually as desired.

In accordance with the present invention, the gate voltage change of the JFET is influenced indirectly by providing at least one control resistor linked to the gate connection of the MOSFET of the hybrid power MOSFET. This control resistor forms, together with a gate/drain capacitance provided for the MOSFET, a time constant for the MOSFET. Using this timer, the MOSFET turns off more slowly. In other words, the drain voltage of the MOSFET rises more slowly, as a result of which the JFET also turns off more slowly on account of the negative feedback of the drain voltage of the MOSFET to the gate of the JFET. So that as the change in the gate voltage of the JFET is reduced, the time delay of the MOSFET needs to be very large. This means that higher switching losses need to be accepted for the MOSFET.

In accordance with another exemplary embodiment, indirectly influencing the gate voltage change of the JFET consists of a decoupling apparatus being provided, one side of which is connected to a source connection of the JFET and the other side of which is connected to a drain connection of the MOSFET of the hybrid power MOSFET. This decoupling apparatus alters the source potential of the JFET such it causes the JFET to turn off slowly.

The simplest embodiment of such a coupling apparatus is an inductance. Depending on the current flowing through this inductance, a voltage drop is produced across this inductance which raises the source potential of the JFET, as a result of which the JFET turns off more slowly.

In one particularly advantageous embodiment of this simple embodiment of the decoupling apparatus, the inductance used is an elongated bonding wire.

BRIEF DESCRIPTION OF THE DRAWINGS

For a complete understanding of the present invention and the advantages thereof, reference is now made to the following description taken in conjunction with the accompanying drawings in which like reference numbers indicate like features, components and method step, and wherein.

DETAILED DESCRIPTION OF THE INVENTION

Figure 1:
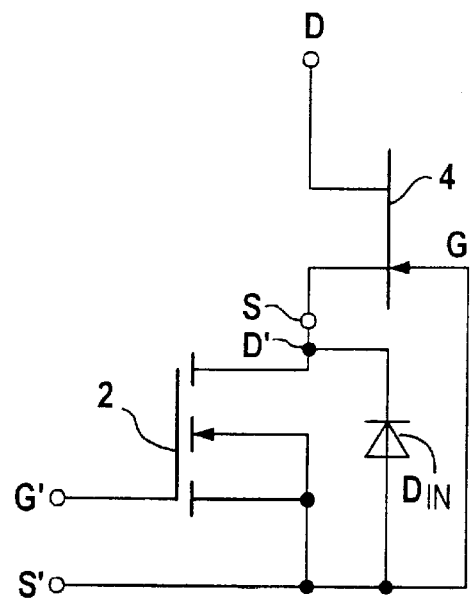
FIG. 1 illustrates the circuit of a known hybrid power MOSFET.
Figure 2:
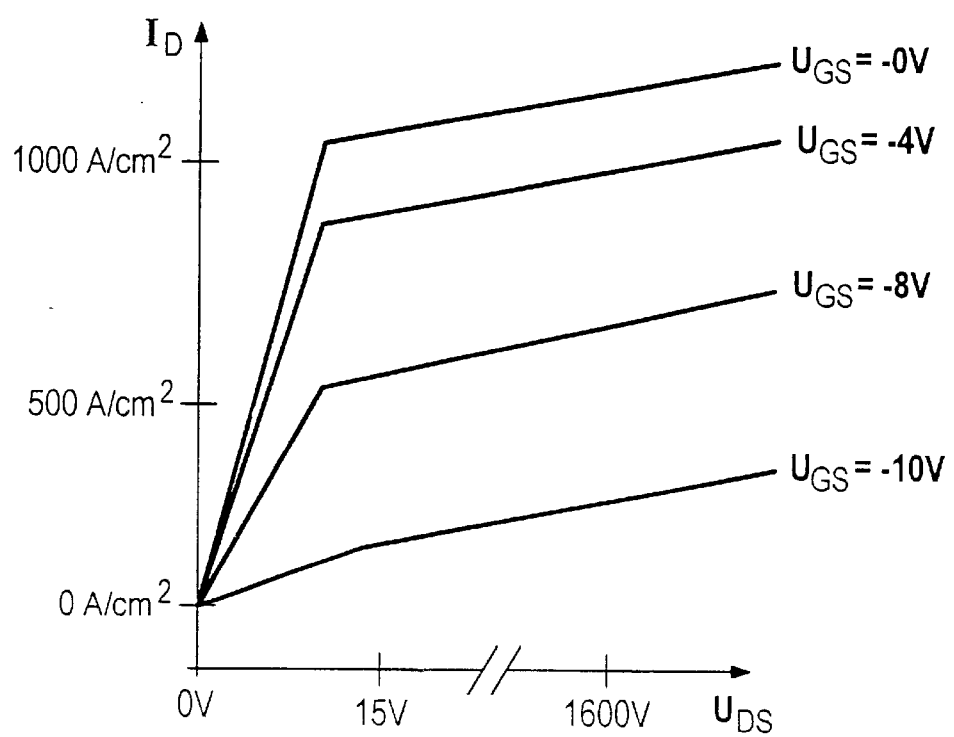
FIG. 2 illustrates output characteristics for a JFET.
Figure 3:
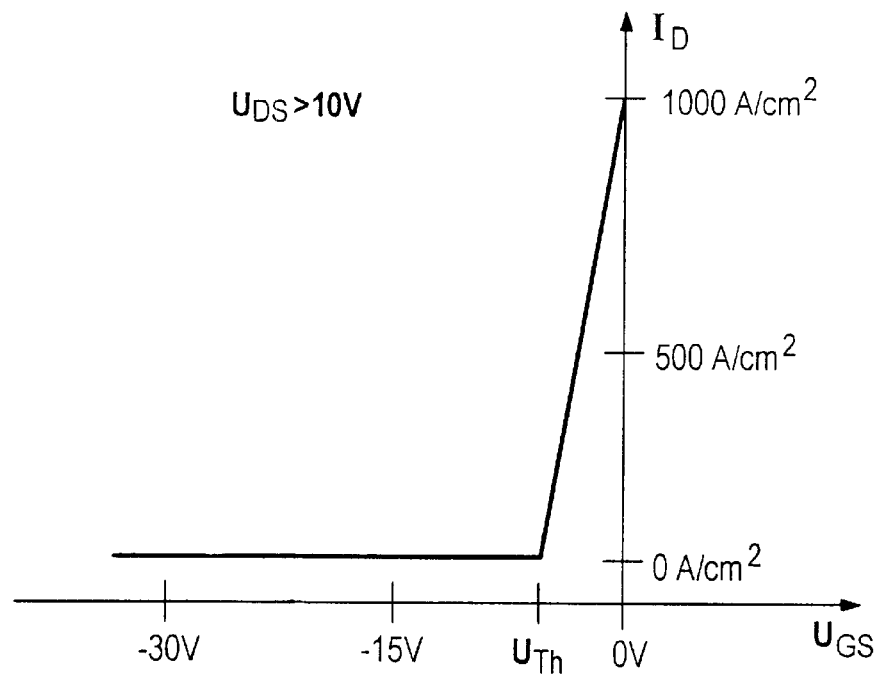
FIG. 3 illustrates transfer characteristic for a JFET.
Figure 4:
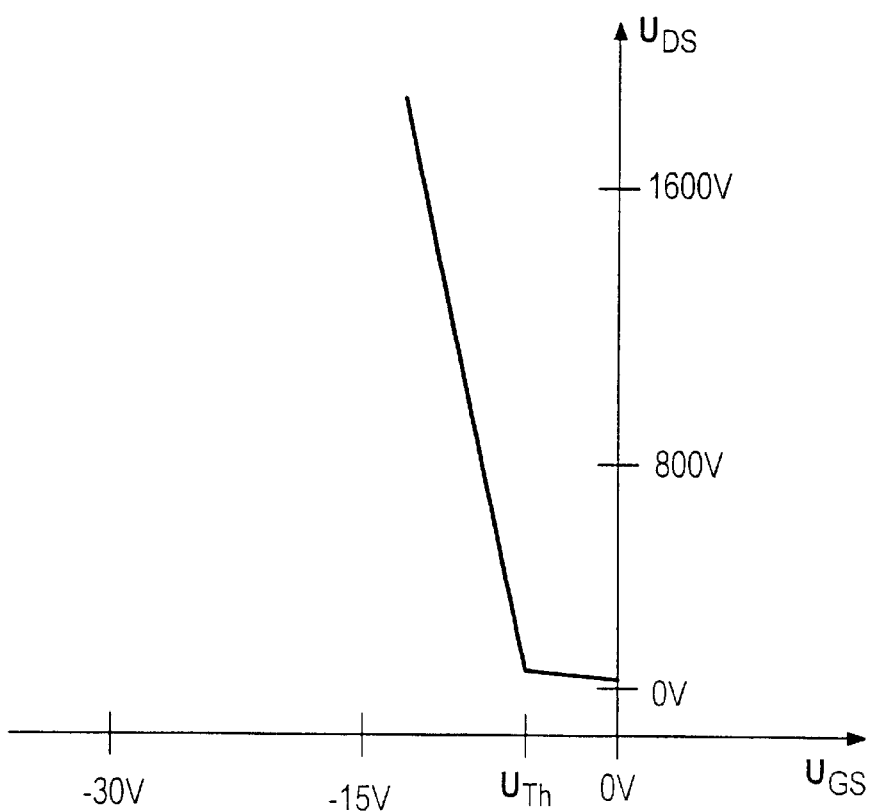
FIG. 4 is a graph showing the drain voltage of a JFET over the gate voltage for a constant drain current.
Figure 5:
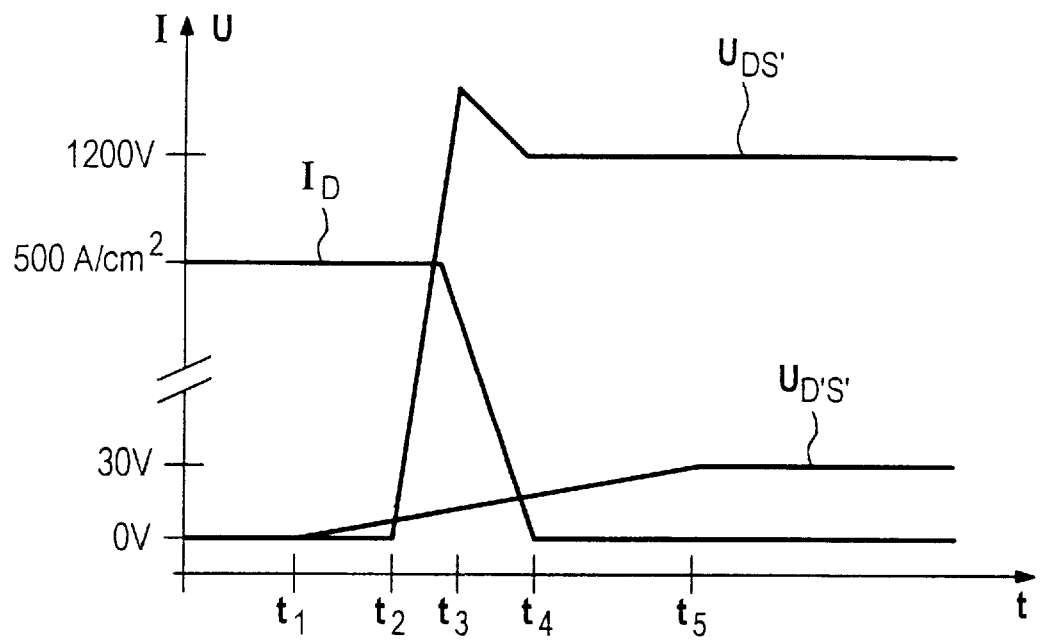
FIG. 5 is a graph showing the turn-off operation of the hybrid power MOSFET of FIG. 1 over time "t"
Figure 6:
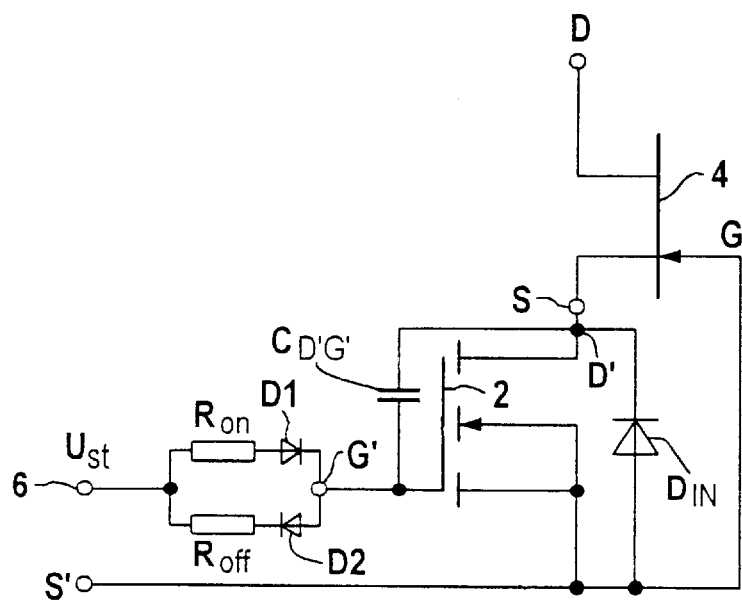
FIG. 6 illustrates an exemplary embodiment of the inventive hybrid power MOSFET of the present invention.

Now referring to the drawings, FIG. 6 illustrates a first embodiment of the inventive hybrid power MOSFET. In this embodiment, the device provided for reducing the change in the gate voltage of the junction FET 4 is a control resistor $R_{off}$ linked to a gate connection G' of the MOSFET 2. In this illustration, a control resistor $R_{on}$ is likewise provided and is likewise linked to the gate connection G' of the MOSFET 2.

So that these two control resistors $R_{off}$ and $R_{on}$ can be used only in a predetermined operating state, a respective decoupling diode D1, D2 is arranged between the control resistors $R_{off}$ and $R_{on}$ and the gate connection G' of the MOSFET 2. These control resistors $R_{off}$ and $R_{on}$ form a respective timer with the gate/drain capacitance $C_{D'G'}$ provided for the MOSFET 2. The control voltage $U_{st}$ applied to the control connection 6 is slowed by means of the timers, so that the MOSFET 2 of the hybrid power MOSFET turns off more slowly. The slowed voltage change on the MOSFET 2 means that the gate voltage $U_{GS'}$ of JFET 4 changes correspondingly slowly. So that the switching edge of JFET 4 can be flattened adequately, the drain voltage $U_{D'S'}$ of MOSFET 2 needs to change very slowly. This means that MOSFET 2 of the hybrid power MOSFET is operated longer in the active area, so that the switching losses of MOSFET 2 increase. For the switching edges of JFET 4 to be able to be altered separately for turning on and for turning off, a respective control resistor $R_{on}$ and $R_{off}$ is provided for the turn-on and turn-off operations, the resistors having different values.

In a second embodiment, the device provided for reducing the change in the gate voltage of JFET 4 is a decoupling apparatus, one side of which is electrically conductively connected to the gate connection G of JFET 4 and the other side of which is electrically conductively connected to the source connection S' of MOSFET 2. In a simple embodiment, the decoupling apparatus provided is a gate resistor $R_{GJ}$. This gate resistor $R_{GJ}$ forms, with the ever-present gate capacitance $C_{GSJ}$ of JFET 4, a timer whose time constant is determined by the value of the gate resistor $R_{GJ}$ and by the value of the gate capacitance $C_{GSJ}$. A rapid change in the drain voltage $U_{D'S'}$ of MOSFET 2 is fed back negatively to the gate connection G of JFET 4 more slowly using this timer. The switching edge of JFET 4 can be set on the basis of the value of the gate resistor $R_{GJ}$. If it is necessary to be able to set the switching edge of JFET 4 as desired, a capacitor $C_Z$ is electrically connected in parallel with the gate capacitance $C_{GSJ}$ provided. This option of using an external capacitor $C_Z$ is shown by means of a broken line. This setting for the switching edge of JFET 4 applies to the turn-on operation and to the turn-off operation.

Figure 7:
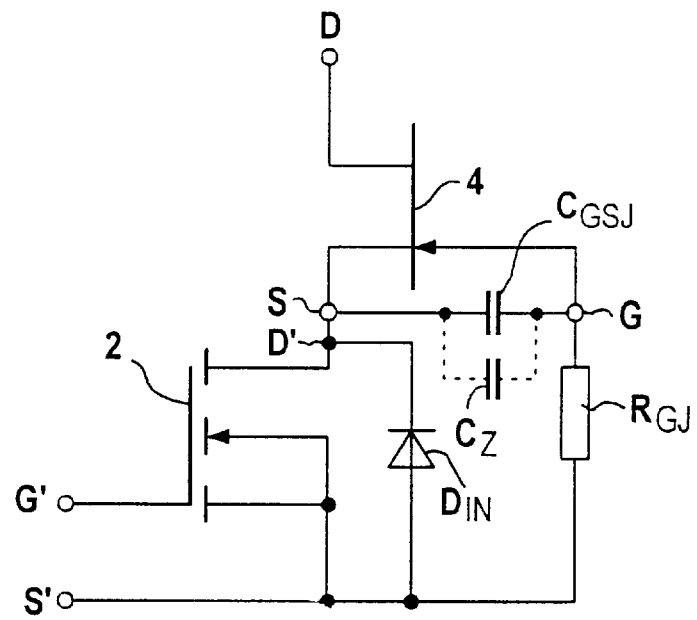
FIG. 7 illustrates another exemplary embodiment of the inventive hybrid power MOSFET of the present invention.
Figure 8:
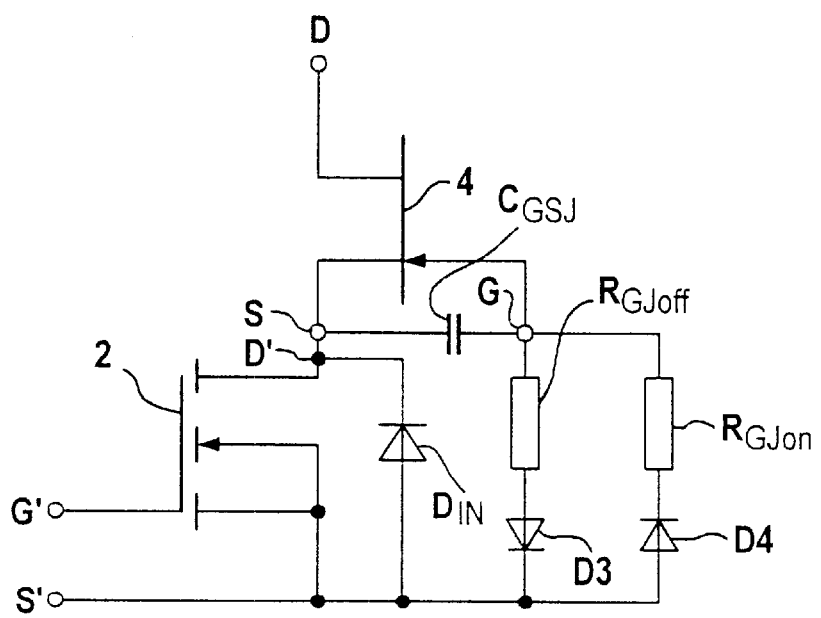
FIG. 8 illustrates another exemplary embodiment of the inventive hybrid power MOSFET of the present invention.

FIG. 8 shows an embodiment of the decoupling apparatus used to set the switching edges of JFET 4 separately from one another for turning on and turning off. To this end, the decoupling apparatus has not only the gate resistor $R_{GJoff}$ for turning off but also a gate resistor $R_{GJon}$ for turning on. The two gate resistors $R_{GJoff}$ and $R_{GJon}$ have a respective decoupling diodes D3 and D4 electrically connected in series with them, so that only one gate resistor $R_{GJoff}$ or $R_{GJon}$ is used, depending on operation. In this embodiment of the decoupling apparatus, one of the two decoupling diodes D3 and D4 can be omitted. Assuming that only the decoupling diode D4 is present, the effective resistance for turning off is equal to the resistance $R_{GJoff}$, and the effective resistance for turning on is equal to the parallel circuit comprising the resistors $R_{GJoff}$ and $R_{GJon}$. The capacitor $C_Z$ mentioned in FIG. 7, which is electrically connected in parallel with the gate capacitance $C_{GJ}$, can also be used for this embodiment.

Figure 9:
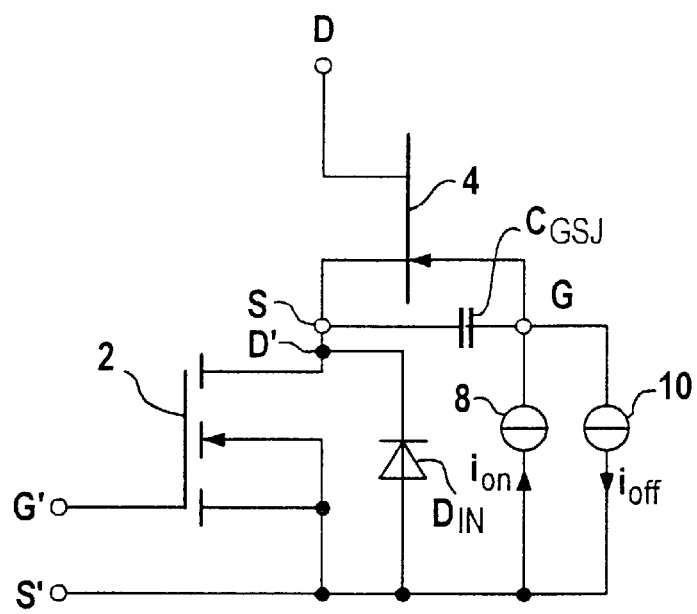
FIG. 9 illustrates another exemplary embodiment of the inventive hybrid power MOSFET of the present invention.

In another embodiment of the decoupling apparatus, two current sources 8 and 10 are provided. Such an embodiment is shown in more detail in FIG. 9. These current sources 8 and 10 are used to charge the gate G of JFET 4 for turning on and to discharge it for turning off. The level of the current $i_{on}$ or $i_{off}$ determines the switching edge of JFET 4 for turning on or off. These two current sources 8 and 10 are controlled by the drain voltage $U_{D'S'}$ of MOSFET 2 of the hybrid power MOSFET.

Figure 10:
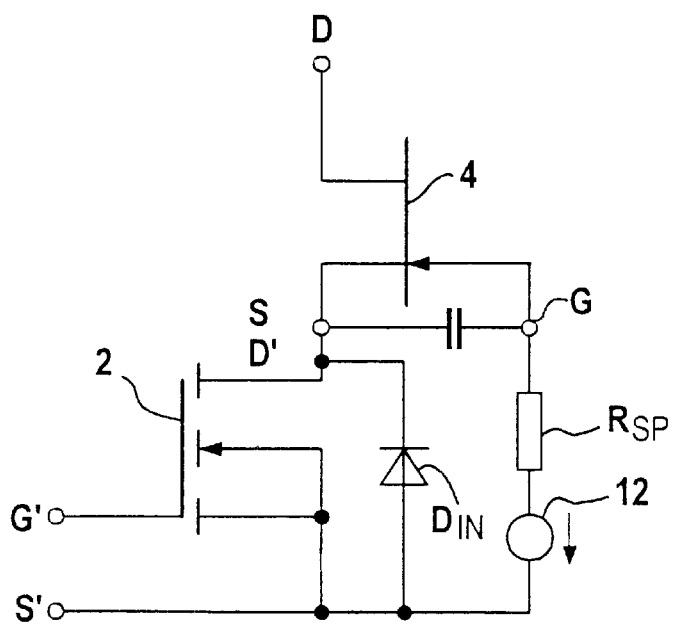
FIG. 10 illustrates another exemplary embodiment of the inventive hybrid power MOSFET of the present invention.

Instead of current sources 8 and 10 as decoupling apparatus, it is also possible to provide a controlled voltage source 12, as illustrated in FIG. 10. Electrically connected in series with the controlled voltage source 12 is a resistor which determines a current value on the basis of the voltage of the voltage source 12.

FIGS. 7 to 10 show various embodiments for a decoupling apparatus, one side of which is electrically conductively connected to the gate connection G of JFET 4 and the other side of which is electrically conductively connected to the source connection S' of MOSFET 2 of the hybrid power MOSFET. This decoupling apparatus is used to have a direct influence on the change in the gate voltage $U_{GS'}$ of JFET 4. By inserting the decoupling apparatus in the manner shown in FIGS. 7 to 10, the hard coupling between the gate voltage $U_{GS'}$ of JFET 4 and the drain voltage $U_{D'S'}$ of MOSFET 2 is decoupled.

Figure 11:
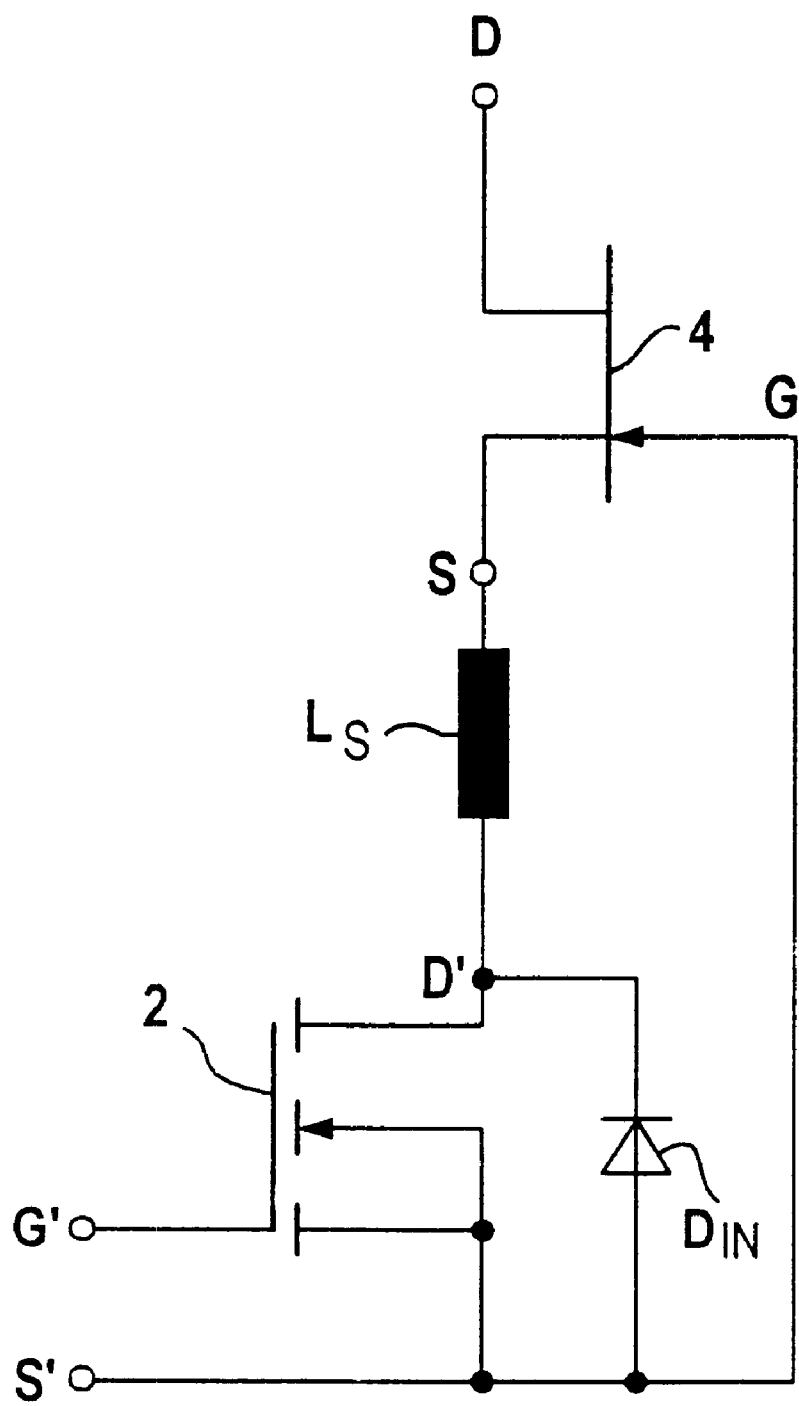
FIG. 11 illustrates another exemplary embodiment of the inventive hybrid power MOSFET of the present invention.

If the current edge of JFET 4 is to be influenced, preferably, an inductance is incorporated into the gate loop of JFET 4 (FIG. 11). Referring to FIG. 11, an inductance $L_S$ is connected between the source connection S of the JFET and the drain connection D' of MOSFET 2. Since very small values for the inductance $L_S$ result in marked voltage drops across the inductance $L_S$ with corresponding current gradients, the value of the inductance $L_S$ can be very small. This means that such an inductance $L_S$ can be produced by an elongated bonding wire in the hybrid power MOSFET between the connections S and D'. When the hybrid power MOSFET turns on, a current is established in the inductance $L_S$ and produces a voltage drop across this inductance $L_{S'}$. This voltage drop raises the source potential of JFET 4 and thus slows down the turning-on of JFET 4. Turning-off is slowed down in a similar manner.

With the inventive device of the present invention for reducing the change in the gate voltage $U_{GS'}$ of the junction FET 4 of a hybrid power MOSFET, high over-voltages no longer arise and the EMC response is much improved.

Although the present invention has been described in detail with reference to specific exemplary embodiments thereof, various modifications, alterations and adaptations may be made by those skilled in the art without departing from the spirit and scope of the invention. It is intended that the invention be limited only by the appended claims.

We claim:

1. A hybrid power MOSFET comprising of a MOSFET and a junction FET, wherein the MOSFET and the FET are electrically connected in series such that a source connection of the FET is connected in an electrically conductive manner to a drain connection of the MOSFET, and a gate connection of the FET is connected in like manner to a source connection of the MOSFET, and further wherein a device for reducing variation of the FET's gate voltage is provided and which is connected at an input having a control voltage.

2. A hybrid power MOSFET according to claim 1, wherein the device comprises at least one control resistor linked to the gate connection of the MOSFET.

3. A hybrid power MOSFET comprising of a MOSFET and a junction FET, wherein the MOSFET and the FET are electrically connected in series such that a source connection of the FET is connected in an electrically conductive manner to a drain connection of the MOSFET, and a gate connection of the FET is connected in like manner to a source connection of the MOSFET, and further wherein a device for reducing variation of the FET's gate voltage is provided and which is connected to a gate connection of the FET and to a source connection of the MOSFET.

4. A hybrid power MOSFET comprising of a MOSFET and a junction FET wherein the MOSFET and the FET are electrically connected in series such that a source connection of the FET is connected in an electrically conductive manner to a drain connection of the MOSFET, and a gate connection of the FET is connected in like manner to a source connection of the MOSFET, and further wherein a device for reducing variation of the FET's gate voltage is provided and which is connected to a source connection of the FET and to a drain connection of the MOSFET.

5. A hybrid power MOSFET according to claim 3 or 4 wherein the device comprises a decoupling apparatus.

6. A hybrid power MOSFET according to claim 5, wherein the decoupling apparatus comprises a gate resistor.

7. A hybrid power MOSFET according to claim 5, wherein the decoupling apparatus comprises two gate resistors electrically connected in parallel and a decoupling diode electrically connected in series with at least one gate resistor.

8. A hybrid power MOSFET according to claim 6, said device comprising a condenser electrically connected in parallel with a gate source junction of the FET.

9. A hybrid power MOSFET according to claim 7, said device comprising a condenser electrically connected in parallel with a gate/source junction of the FET.

10. A hybrid power MOSFET according to claim 5, wherein the decoupling apparatus comprises at least one source of current.

11. A hybrid power MOSFET according to claim 5, wherein the decoupling apparatus comprises a controlled voltage source.

12. A hybrid power MOSFET according to claim 5, wherein the decoupling apparatus comprises an inductance.

13. A hybrid power MOSFET according to claim 12, wherein the inductance comprises an elongated bonding wire.

14. A hybrid power MOSFET according to claims 1, 3 or 4, wherein the MOSFET is a low-voltage power MOSFET.

15. A hybrid power MOSFET according to claims 1, 3 or 4, wherein the MOSFET comprises silicon.

16. A hybrid power MOSFET according to claims 1, 3 or 4, wherein FET comprises silicon carbide.

* * * * *